United States Patent
Sung

(10) Patent No.: US 10,168,390 B2
(45) Date of Patent: Jan. 1, 2019

(54) SYSTEM AND METHOD FOR MANAGING BATTERY ON THE BASIS OF TIME REQUIRED FOR CHARGING

(71) Applicants: Hyundai Motor Company, Seoul (KR); Kia Motors Corporation, Seoul (KR)

(72) Inventor: Woo Suk Sung, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 98 days.

(21) Appl. No.: 15/372,836

(22) Filed: Dec. 8, 2016

(65) Prior Publication Data

US 2018/0031642 A1 Feb. 1, 2018

(30) Foreign Application Priority Data

Aug. 1, 2016 (KR) .......................... 10-2016-0098063

(51) Int. Cl.
*G01N 27/416* (2006.01)
*G01R 31/36* (2006.01)
*H02J 7/00* (2006.01)

(52) U.S. Cl.
CPC ..... *G01R 31/3679* (2013.01); *G01R 31/3651* (2013.01); *G01R 31/3658* (2013.01); *H02J 7/0052* (2013.01)

(58) Field of Classification Search
CPC ............... G01R 31/36; G01R 31/3662; G01R 31/3648; G01R 31/3658; G01R 31/3651; G01R 31/3624; G01R 31/3675; G01R 31/3679; G01R 31/361; G01R 31/3606; H01M 10/4285; H01M 10/486; H01M 10/42; H01M 10/48; H01M 10/484; B60L 2240/80; B60L 2240/549; B60L 2240/547; B60L 2240/545

See application file for complete search history.

(56) References Cited

U.S. PATENT DOCUMENTS

| | | | |
|---|---|---|---|
| 8,498,766 B2 | 7/2013 | Takahashi et al. | |
| 2006/0284600 A1* | 12/2006 | Verbrugge | G01R 31/3651 320/132 |
| 2007/0159137 A1* | 7/2007 | Verbrugge | G01R 31/361 320/132 |

(Continued)

FOREIGN PATENT DOCUMENTS

| | | |
|---|---|---|
| KR | 10-0911317 B1 | 7/2009 |
| KR | 10-2012-0114584 A | 10/2012 |

(Continued)

*Primary Examiner* — Thang X Le
(74) *Attorney, Agent, or Firm* — Morgan, Lewis & Bockius LLP

(57) ABSTRACT

Provided are a weighted least square (WLS)-based state of health (SOH) estimating system and method. A battery management system according to an aspect of the present invention includes a measurer measuring a time required for charging at each of preset voltage intervals within a preset voltage range in which a battery is charged with a constant current; and an estimator estimating a parameter using an estimated value of time required for charging according to a preset metamodel and a measured value of a time required for charging after completion of the constant current charging.

20 Claims, 18 Drawing Sheets

(56) References Cited

U.S. PATENT DOCUMENTS

| | | | |
|---|---|---|---|
| 2012/0256599 A1 | 10/2012 | Gu | |
| 2014/0055100 A1* | 2/2014 | Igarashi | H02J 7/00 320/152 |
| 2015/0301122 A1 | 10/2015 | Lee | |
| 2015/0377972 A1* | 12/2015 | Bussar | H01M 10/48 702/63 |
| 2016/0041231 A1 | 2/2016 | Lee | |
| 2016/0146898 A1* | 5/2016 | Lennevi | G01R 31/3679 324/426 |
| 2016/0187432 A1* | 6/2016 | Saint-Marcoux | G01R 31/3651 702/63 |

FOREIGN PATENT DOCUMENTS

| | | |
|---|---|---|
| KR | 10-2013-0126231 A | 11/2013 |
| KR | 10-2016-0017416 A | 2/2016 |

\* cited by examiner

SYSTEM AND METHOD FOR MANAGING BATTERY ON THE BASIS OF TIME REQUIRED FOR CHARGING

CROSS-REFERENCE TO RELATED APPLICATION

The present application claims priority to Korean Patent Application No. 10-2016-0098063, filed on Aug. 1, 2016, the entire contents of which is incorporated herein for all purposes by this reference.

BACKGROUND OF THE INVENTION

Field of the Invention

The present invention relates to a battery management technology, and more particularly, to a weighted least square (WLS)-based state of health (SOH) estimating system and method capable of easily estimating an aging state of a battery.

Description of Related Art

In general, electric vehicles or hybrid electric vehicles (hereinafter, referred to as "electric vehicles") are driven using electric energy of a battery in an electric driving mode. Repeatedly charged and discharged, the battery, a secondary cell, is degenerated to have a degraded function, and thus, a degree of degeneration thereof is required to be evaluated.

An SOH, a parameter quantitatively representing a change in characteristics of battery capacity due to an aging effect, is a yardstick indicating a degree to which battery capacity has been degenerated. SOH is used to adjust battery charging/discharging capacity according to a replacement point of a battery and a battery usage term.

In fact, a change in characteristics of a battery capacity may be estimated by internal battery resistance and temperature. Thus, in the related art, internal battery resistance and battery capacity according to temperatures are measured in advance through charging/discharging experiment, measured capacity against initial capacity is relatively digitized to obtain a look-up table (LUT) for SOH mapping, and SOH corresponding to temperature and internal battery resistance is subsequently estimated.

Here, the internal battery resistance is difficult to directly measure during a battery charging/discharging process, so a technique for accurately measuring internal battery resistance is required.

Simply, internal battery resistance may be indirectly calculated by applying measured values of a battery voltage and a charging/discharging current to the Ohmng process, so a technique for accurately measuring inteas an error with respect to an actual voltage due to an IR drop phenomenon of a battery, and a battery current also has a measurement error, and as a result, SOH calculated using the Ohm's law has a significant error.

Another related art method for estimating SOH to reduce an SOH error is adding up charging/discharging currents of a battery to estimate a state of charge (SOC) of the battery, and estimating SOH using the estimated SOC. In this method, however, as the measurement error that occurs during a process of measuring a current is accumulated, accuracy of SOC used as basic data of SOH estimation is lowered with the lapse of time, resulting in a degradation of reliability of SOH estimation.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a weighted least square (WLS)-based state of health (SOH) estimating system and method capable of estimating an aging state of a battery using WLS technique.

Technical subjects of the present invention are not limited to the foregoing technical subjects and any other technical subjects not mentioned herein may be clearly understood by a person skilled in the art from the present invention described hereinafter.

According to an exemplary embodiment of the present invention, a state of health (SOH) estimating system includes: a measurer calculating a measured value of a time required for charging at each of preset voltage intervals within a preset voltage range in which a battery is constant-current charged; and a parameter estimator calculating an estimated value of the time required for charging at each of voltage intervals by a preset metamodel when the battery voltage is higher than the voltage range, and estimating a battery SOH in which an error between the measured value and the estimated value based on a weighted least square (WLS) is the lowest.

According to another exemplary embodiment of the present invention, a state of health (SOH) estimating method based on at least one processor includes: calculating a measured value of a time required for charging at each of preset voltage intervals within a preset voltage range in which a battery is constant-current charged; calculating an estimated value of the time required for charging at each of voltage intervals according to a predicted SOH by a preset metamodel when the battery voltage is higher than the voltage range; and estimating a predicted SOH in which an error between the measured value and the estimated value based on a weighted least square (WLS) is the lowest, as a battery SOH.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
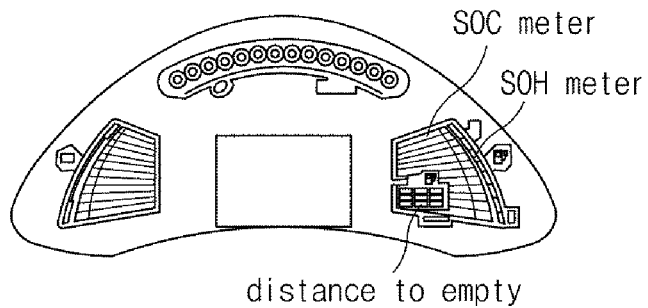
FIG. 1 is a view illustrating an SOC meter and an SOH meter.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Aforementioned subjects, advantages and features of the present invention and implementation methods thereof will be clarified through following exemplary embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art, and the present invention is defined by the category of claims. The technical terms used in this disclosure are only used to explain a specific exemplary embodiment while not limiting the present invention. The terms of a singular form may include plural forms unless referred to the contrary. Also, it will be further understood that the terms "comprise" and/or "comprising," when used herein, specify the presence of stated elements, steps, operations, and/or components but do not preclude the presence or addition of one or more other elements, steps, operations, and/or components.

A theoretical concept of the present invention will be described, before descriptions of a specific configuration of the present invention.

Figure 2A:
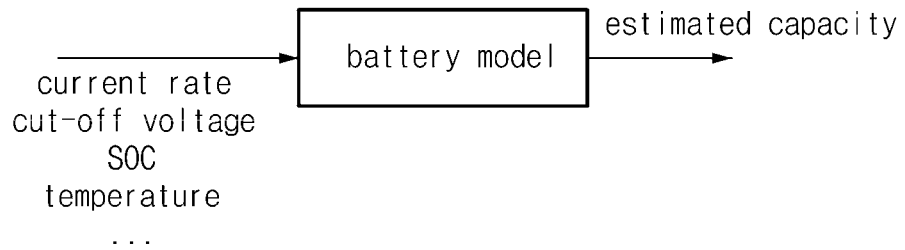
FIG. 2A and FIG. 2B illustrate an open loop battery model and a closed loop battery model.
Figure 2B:
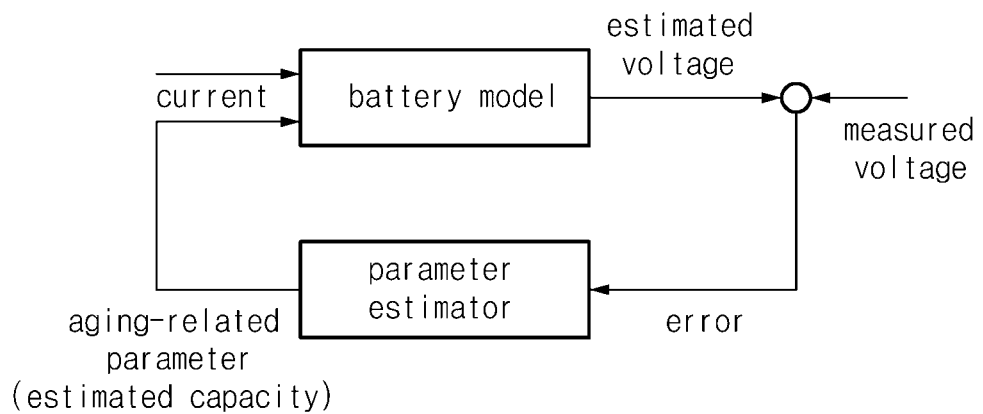
Figure 3A:
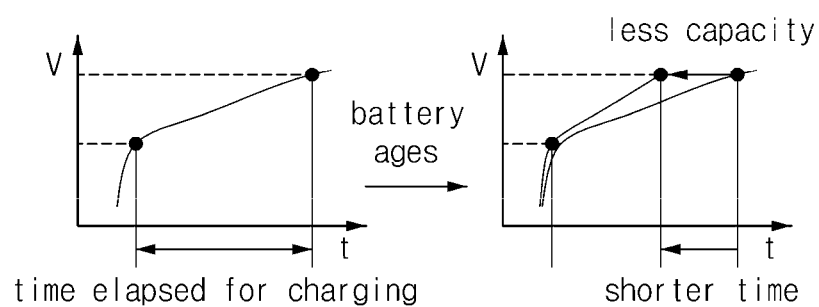
FIG. 3A is a graph illustrating a charge curve in the shape of a voltage function over time required for charging.
Figure 3B:
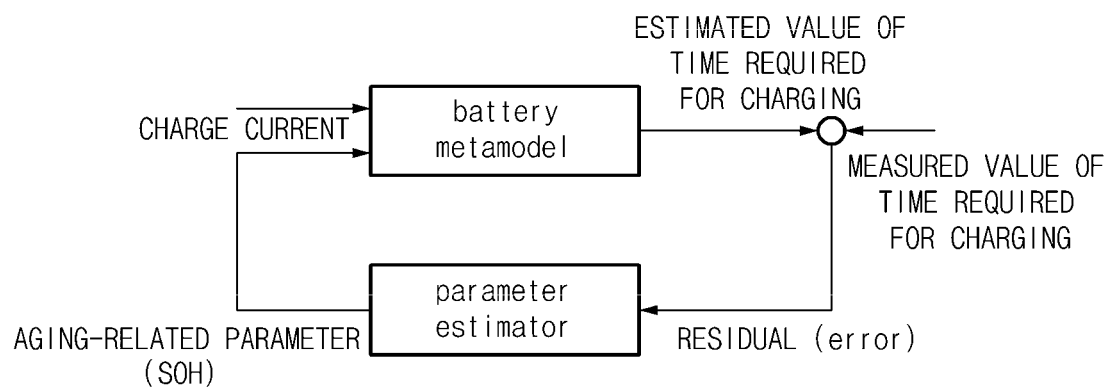
FIG. 3B is a view illustrating a closed loop battery model according to an exemplary embodiment of the present invention.

First, an SOH estimation concept according to an exemplary embodiment of the present invention will be described with reference to FIGS. 1 to 3B. FIG. 1 is a view illustrating a state of charge (SOC) meter and a state of health (SOH) meter, FIGS. 2A and 2B illustrate an open loop battery model and a closed loop battery model, FIG. 3A is a graph illustrating a charge curve in the shape of a voltage function over time required for charging, FIG. 3B is a view illustrating a closed loop battery model according to an exemplary embodiment of the present invention.

Most critical variables in battery management are SOC related to remaining battery capacity and SOH related to a battery aging state.

First, an SOC may be calculated as residual capacity with respect to present capacity as expressed by Equation 1 below. Here, the present capacity and the residual capacity are expressed in unit of hA.

$$SOC = \frac{\text{Residual Capacity}}{\text{Present Capacity}} \quad \text{[Equation 1]}$$

Next, an SOH is calculated as present capacity with respect to initial capacity as expressed by Equation 2 below. The SOH is represented by a value between 0 to 1 or a percentage.

$$SOH = \frac{\text{Present Capacity}}{\text{Initial Capacity}} \quad \text{[Equation 2]}$$

Thus, the SOC is required to be related to the SOH in order to provide more accurate remaining battery capacity.

The SOH may be on-board monitored to provide a battery replacement cycle. For example, Nissan Leaf has an SOC meter and an SOH meter on a dashboard as illustrated in FIG. 1.

Here, the SOC meter is termed an allowable charge gauge, and the SOH meter is termed an available capacity gauge. The SOC meter falls as discharged and rises as charged, but a level of the SOH meter continues to fall unless a battery is replaced.

An SOC estimation technique for estimating an SOC and SOH described above includes an open loop method and a closed loop method.

As illustrated in FIG. 2A, the open loop method outputs estimated capacity, without feedback, using a system model (battery model). Thus, in an open loop battery model, accuracy of capacity estimation is determined based on accuracy of a system model produced empirically (based on Arrhenius equation). An input of the open loop battery model may be variables of a charge/discharge current rate, a charge cutoff voltage, an SOC, and temperature, affecting capacity loss. Here, generally, one or only two of the variables are applied to the open loop battery model, and thus, the variables may be applied without a complicated interaction between a plurality of inputs. However, the open loop battery model has restrictions in representing various scenarios obtained in a real battery usage pattern.

As illustrated in FIG. 2B, the closed loop battery model outputs an estimated voltage regarding feedback and is electrical or electrochemical, and an input thereof is an aging-related parameter. The closed loop battery model uses a measured voltage as a desired output, and thus, it can estimate present capacity even in a real environment condition. However, the closed loop battery model disadvantageously requires more computing resource, compared with the open loop method.

In order to reduce complexity of the battery models, the present invention was devised on the basis of a metamodel representing a battery operation based on an internal battery principle. Here, an interested battery operation is limited to a change in a form of a charge curve depending on battery aging, and thus, the metamodel is configured only for a battery charge area.

In a vehicle versus grid scenario, a battery of a battery electric vehicle (BEV) is a target for charging a constant current, although a current magnitude is different. Here, the current magnitude may vary depending on a power level of a charger selected by a user of a BEV. Based on such characteristics, in the present invention, a battery SOH is estimated using a charge time according to constant current charging.

Hereinafter, a charge curve in the shape of a voltage function over time required for charging according to the present invention will be described with reference to FIGS. 3A and 3B. FIG. 3A is a graph illustrating a charge curve in the shape of a voltage function over time required for charging, and FIG. 3B is a view illustrating a closed loop battery model according to an exemplary embodiment of the present invention.

As illustrated in the right graph of FIG. 3A, time required for charging is reduced due to loss of battery capacity.

As illustrated in FIG. 3B, the metamodel estimates a time required for charging by an output regarding an aging-related parameter (normalized capacity=SOH), an output of a parameter estimator. Thus, a charge curve used in constructing the metamodel has a form of time over voltage.

Here, since a battery terminal voltage is sensitive to a duty cycle, a rest time, a SOC, and temperature, a corresponding variable will resultantly distort the form of the charge curve and affect parameter estimation. However, in the present invention, SOH estimation and weighted least square (WLS) technique are used in parallel to restrain any other factor from affecting the shape of the charge curve than the present capacity.

In this manner, in the present invention, current integration according to time as in the related art is replaced with the WLS of an error between an estimated value of time required for charging and a measured value, thus preventing an estimation error due to current integration and enhancing reliability of capacity estimation.

Also, in the present invention, the present capacity may be effectively estimated using a limited calculation resource of the battery management system based on the combination of the metamodel and the WLS.

☐ Cell Test

Figure 4A:
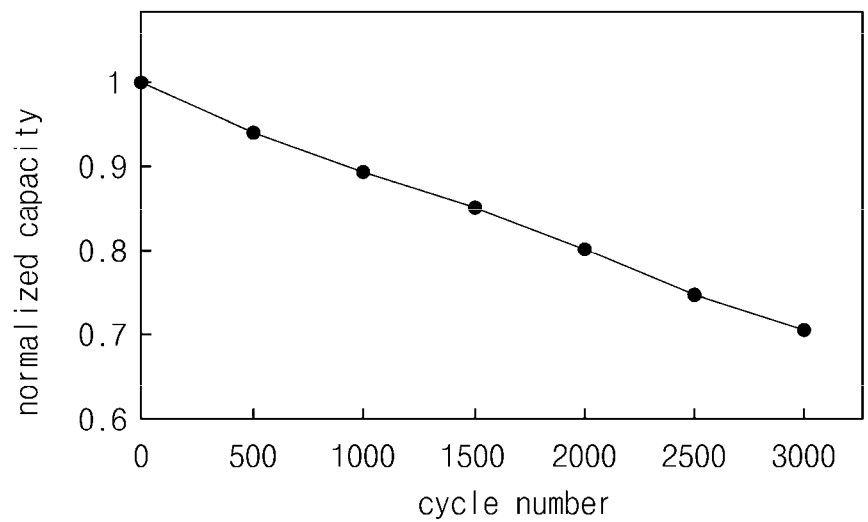
FIG. 4A is a graph illustrating a change in a present capacity during a charge/discharge test process.
Figure 4B:
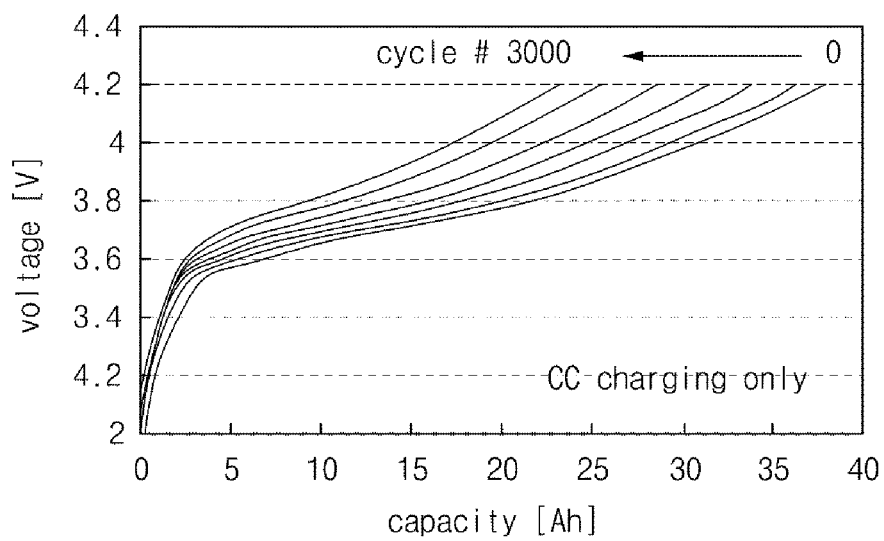
FIG. 4B is a graph illustrating a change in charge curves during a charge/discharge test process.

Hereinafter, results from cell charge/discharge testing will be described with reference to FIGS. 4A and 4B. FIG. 4A is a graph illustrating a change in the present capacity during a charge/discharge test process, and FIG. 4B is a graph illustrating a change in charge curves during a charge/discharge test process. In FIGS. 4A and 4B, charging was performed at a 1C-rate and the present capacity and the charge curve were checked at every 500 cycles of a total of 3000 cycles. Here, test cells had an initial capacity of 42 Ah and each cell included 28 positive electrodes and 29 negative electrodes, all of which were double-sided.

As illustrated in FIG. 4A, the present capacity check testing was performed repeatedly seven times over a total of 3000 cycles which caused 29% capacity loss, short by 1% from the battery life expiration capacity (30%) of an electric vehicle.

As illustrated in FIG. 4B, it is noted that the charge curves were flatly moved in a left upper direction indicating loss of capacity as the battery charge/discharge cycles are increased.

☐ Meta Data Modeling

An optimal model representing an internal principle of a battery may be an electrochemical model, but in actuality, the electrochemical model cannot recognize every operation of a battery easily affected by operational factors such as current, temperature, SOC and SOH.

In contrast, a data-based model according to the present invention is established on the basis of a relationship between input and output data, and thus, battery driving may be easily recognized even without the knowledge of an internal battery principle.

The metamodel is produced from the reaction surface methodology (RSM). For reference, in the RSM, an optimal reaction surface is analyzed through an experiment and a procedure thereof is as follows.

First, an output function value is experimentally obtained from a plurality of sample points of a charge curve. Second, a form of an approximation function of a time required for charging is defined in consideration of tendency of an output function (time required for charging) value according to the input variable (SOH). Third, a coefficient of the approximation function is determined from a minimum square. A process of establishing a metamodel based on the RSM will be described with reference to FIG. 5.

Figure 5:
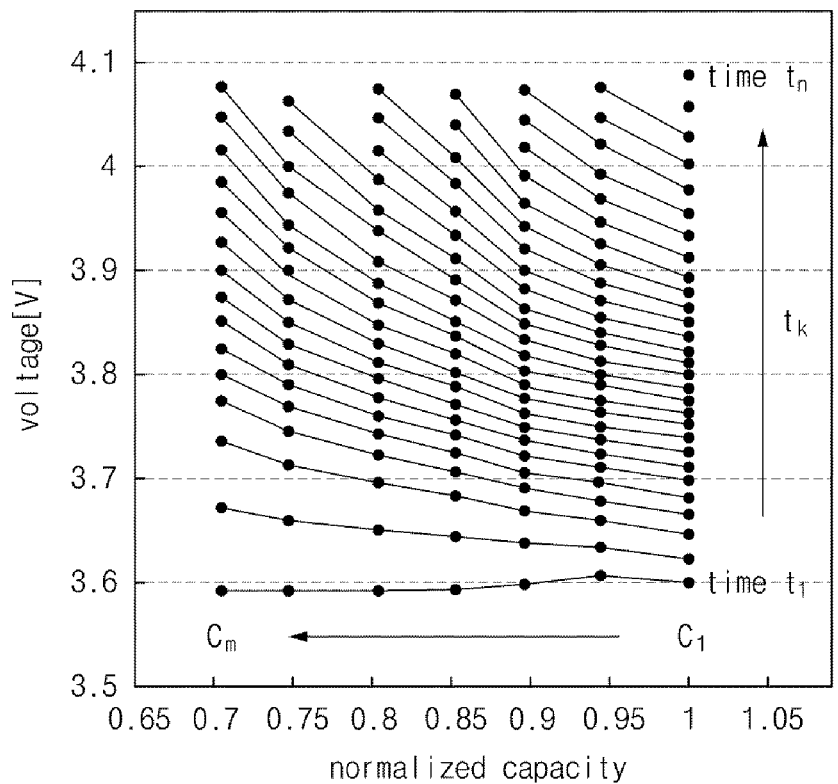
FIG. 5 is a view illustrating a charge curve in the shape of a voltage over normalized capacity.

The charge curve of FIG. 5 is illustrated in the form of the voltage over the normalized capacity. In FIG. 5, it can be seen that, in the constant current charging, the normalized capacity (SOH) is in proportion to time required for charging.

Here, the normalized capacity is set as a unique input variable of the metamodel, and the battery voltage is determined by an output function. As mentioned above, SOH is a normalized capacity as a result of normalizing the present capacity by an initial capacity. For example, when the present capacity is 29.4 Ah, SOH is 0.7 (=29.4/42).

In FIG. 5, response data, a battery voltage $V_{ki}$ according to the normalized capacity $c_i$(i=1 to m) and time $t_k$ required for charging (k=1 to n) is obtained from battery cell testing. Also, an interval of the time $t_k$ required for charging for 2C rate (n=29) 1 Ah is about 41.86 seconds. The number of normalized capacities ($C_i$) is 7, and $C_1$ and $C_7$, boundaries of an upper part and a lower part in consideration of a lifespan expiration capacity of the battery of the electric vehicle is 1 and 0.7, respectively.

In FIG. 5, the output function value is expressed as points in discrete values of the normalized capacity and the time required for charging. In FIG. 5, it can be seen that a battery voltage at the time $t_k$ required for charging is monotonously changed to correspond to the normalized capacity.

Thus, three-dimensional polynomial expression was determined as an output function for approximating an output voltage to correspond to the normalized capacity according to each time required for charging. Thus, a shape of the charge curve according to the time $t_k$ required for charging may become a parameter in the form of approximation as expressed by Equation 3 below.

$$V_k(c) = \sum_{p=0}^{2} a_{kp} c^p = a_{k0} + a_{k1}c + a_{k2}c^2 + a_{k2}c^3 \quad \text{[Equation 3]}$$

In Equation 3, the coefficient $a_{kp}$ is calculated to be matched to the original response data in the time $t_k$ required for charging using an ordinary least square (OLS). Since the function of the polynomial expression is linear to correspond to the coefficient $a_{kp}$, a typical linear regression algorithm may be defined by m*4 matrix X as expressed by Equation 4 below.

$$X = \frac{\partial V_k(c)}{\partial a_{kp}} = \begin{bmatrix} 1 & c_1 & c_1^2 & c_1^3 \\ 1 & c_2 & c_2^2 & c_2^3 \\ \vdots & \vdots & \ddots & \vdots \\ 1 & c_m & c_m^2 & c_m^3 \end{bmatrix}. \quad \text{[Equation 4]}$$

Here, the matrix $a_{kp}$ may be defined as expressed by Equation 5.

$$a_{kp} = \begin{bmatrix} a_{10} & a_{20} & \cdots & a_{n0} \\ a_{11} & a_{21} & \cdots & a_{n1} \\ a_{12} & a_{22} & \cdots & a_{n2} \\ a_{13} & a_{23} & \cdots & a_{n3} \end{bmatrix} = (X^T X)^{-1} X^T y \quad \text{[Equation 5]}$$

$$a_{kp} = \begin{bmatrix} a_{10} & a_{20} & \cdots & a_{n0} \\ a_{11} & a_{21} & \cdots & a_{n1} \\ a_{12} & a_{22} & \cdots & a_{n2} \\ a_{13} & a_{23} & \cdots & a_{n3} \end{bmatrix} = (X^T X)^{-1} X^T y$$

In Equation 5, y may be a m*n matrix including a voltage $V_{ki}$ corresponding to the normalized capacity $c_i$ as expressed by Equation 6 below.

$$y = V_{ki} = \begin{bmatrix} V_{11} & V_{21} & \cdots & V_{n1} \\ V_{12} & V_{22} & \cdots & V_{n2} \\ \vdots & \vdots & \ddots & \vdots \\ V_{1m} & V_{2m} & \cdots & V_{nm} \end{bmatrix} \quad \text{[Equation 6]}$$

☐ Cell-Level Validation

Figure 6:
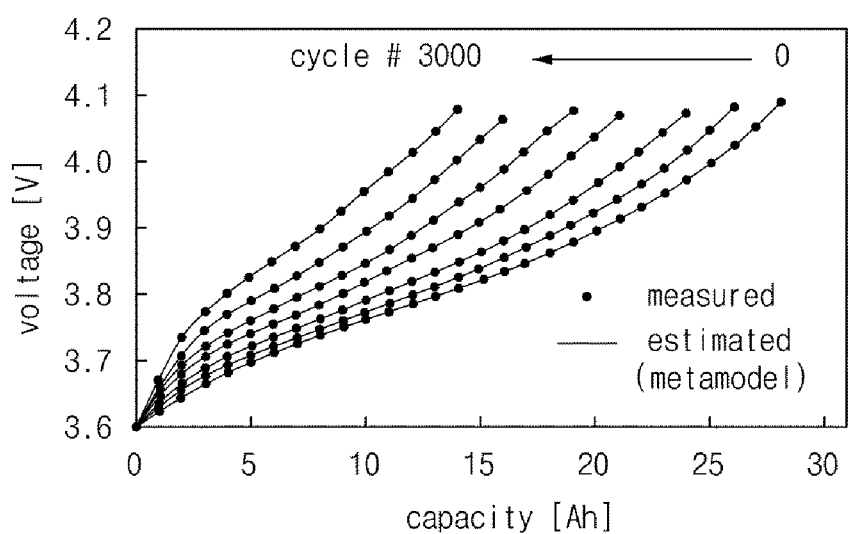
FIG. 6 is a graph illustrating a change in a present capacity in accordance with battery aging.
Figure 7:
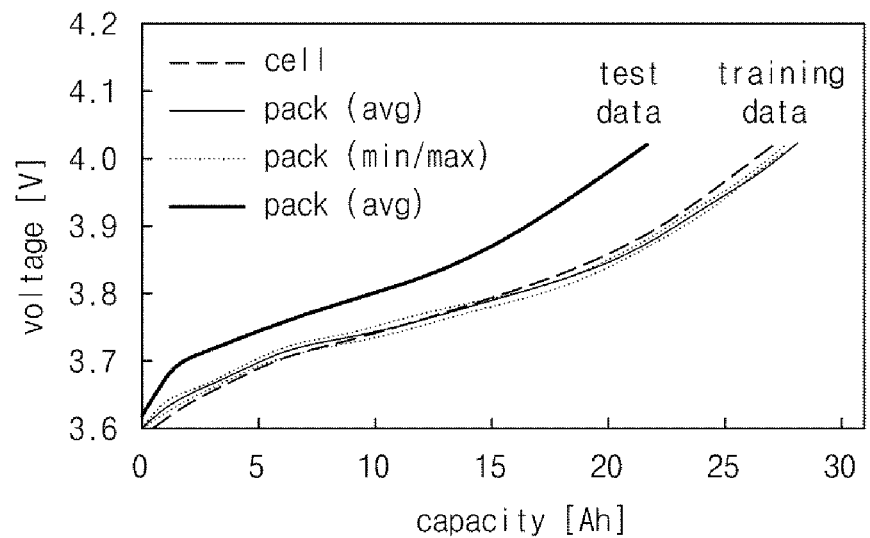
FIG. 7 is a view illustrating a difference between training data based on a present capacity estimation and test data according to an exemplary embodiment of the present invention.

Hereinafter, a process of validating an established metamodel using training data will be described with reference to FIGS. 6 and 7. FIG. 6 is a graph illustrating a change in a present capacity in accordance with battery aging, and FIG. 7 is a view illustrating a difference between training data based on a present capacity estimation and test data according to an exemplary embodiment of the present invention. In FIGS. 6 and 7, a case in which a cell and a pack are charged at a 2 C rate corresponding to 90 kW quick charging.

The established metamodel is first validated with respect to training data. The training data is used to discover a change in the shape of a charge curve corresponding to capacity loss. The training data refers to cell level battery charging repeated until the present capacity reaches a lifespan expiration capacity of the battery of the electric vehicle in a different current.

In FIG. 6, a metamodel based on a 3D polynomial expression which is sufficiently excellent for confirming a change in the shape of the charge curve according to loss of capacity of almost 30% is illustrated.

An estimation error was calculated to evaluate accuracy of the metamodel, and a relative error in each cycle may be calculated as expressed by Equation 7 below.

$$e_i = \frac{1}{n} \sum_{k=1}^{n} \left| \frac{V_{ki}^* - V_{ki}}{V_{ki}} \right| \times 100 \quad \text{[Equation 7]}$$

Here, $v_{ki}$* and $v_{ki}$ are voltages measured at time $t_k$ and at the cycle.

A relative error was calculated to be less than 0.05% on average within a maximum of 0.15% at cycles of 500, 1000, 1500, 2000, 2500, and 3000.

As illustrated in FIG. 7, the present capacity should be almost the same as the initial capacity, but the test data and the training data are completely different. This is because the operational factors affecting the present capacity affected the shape of the charge curve.

Figure 8:
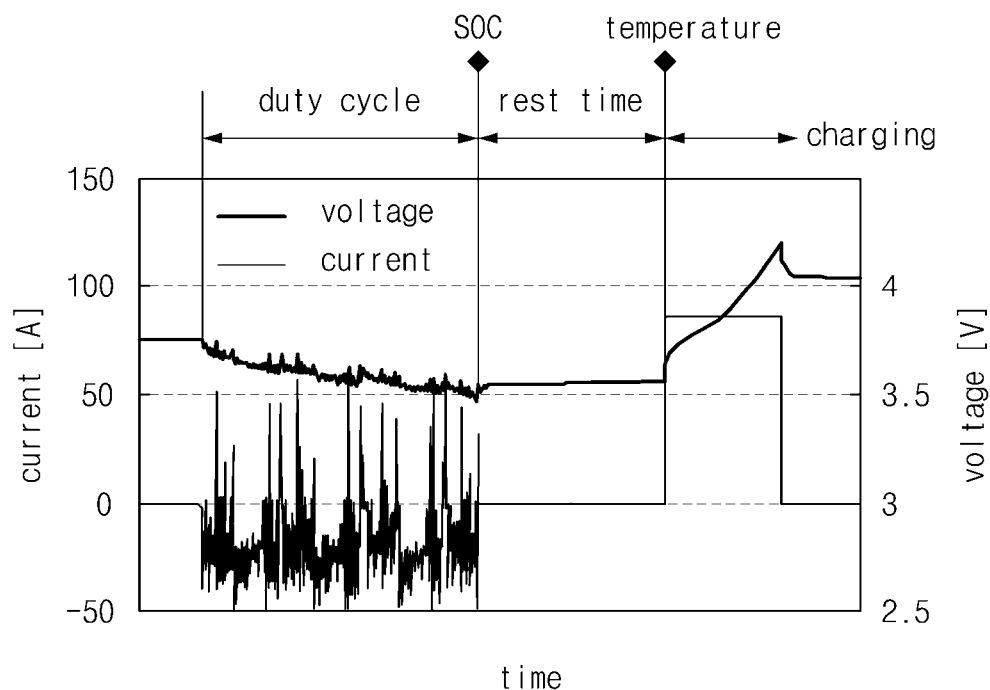
FIG. 8 is a graph illustrating operational factors affecting a charge curve.

Hereinafter, parameter estimation using operational factors will be described with reference to FIGS. 8 to 9D. FIGS. 8 to 9D illustrate a case in which a cell and a pack were charged at a 2 C rate corresponding to 90 kW quick charging.

First, FIG. 8 is a graph illustrating operational factors affecting a charge curve.

As illustrated in FIG. 8, in the present invention, duty cycle, rest time, SOC, and temperature are selected as operational factors affecting the shape of the charge curve in consideration of a charge operation of an owner of an electric vehicle.

Hereinafter, the operational factors will be described with reference to FIGS. 9A to 9D. FIGS. 9A to 9D are graphs illustrating changes in charge curves due to the operational factors. Here, the charge curve is marked in the form of a voltage (y axis) over capacity (x axis), and in the corresponding testing, the cell was charged at a 1.45 C rate corresponding to 50 kW quick charging.

① SOC

Figure 9A:
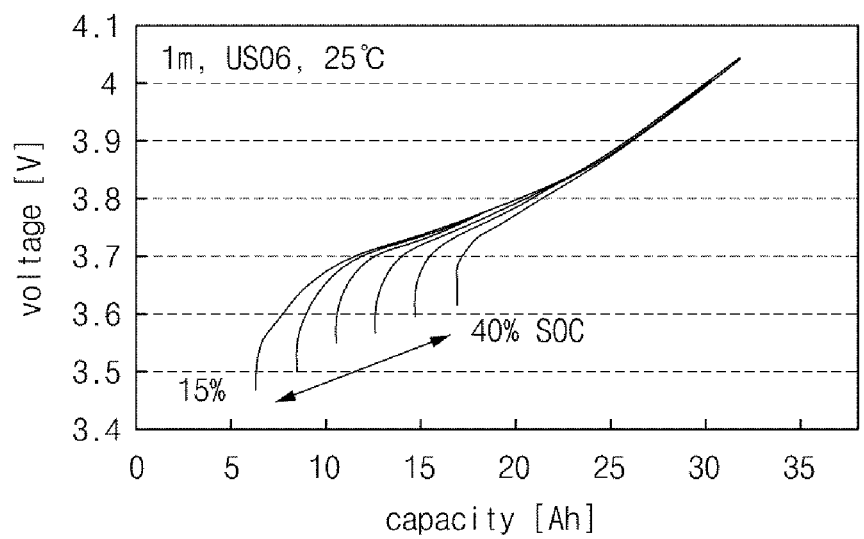
FIG. 9A, FIG. 9B, FIG. 9C, and FIG. 9D are graphs illustrating a change in charge curve due to various operational factors.

As illustrated in FIG. 9A, a start point of the charge curve is determined by a residual capacity and a charge start voltage (SOC), and an end point of the charge curve is determined by a present capacity and a charge completion voltage.

② Rest Time

Figure 9B:
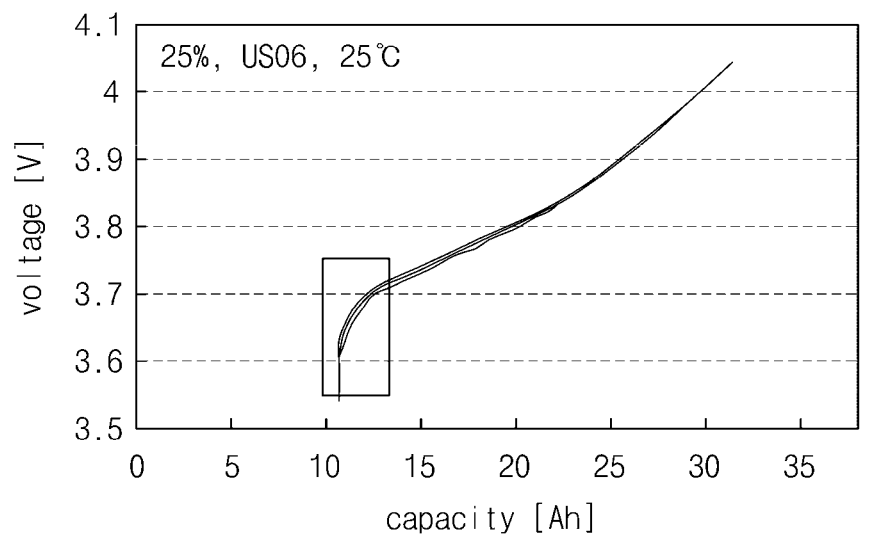
Figure 9B:
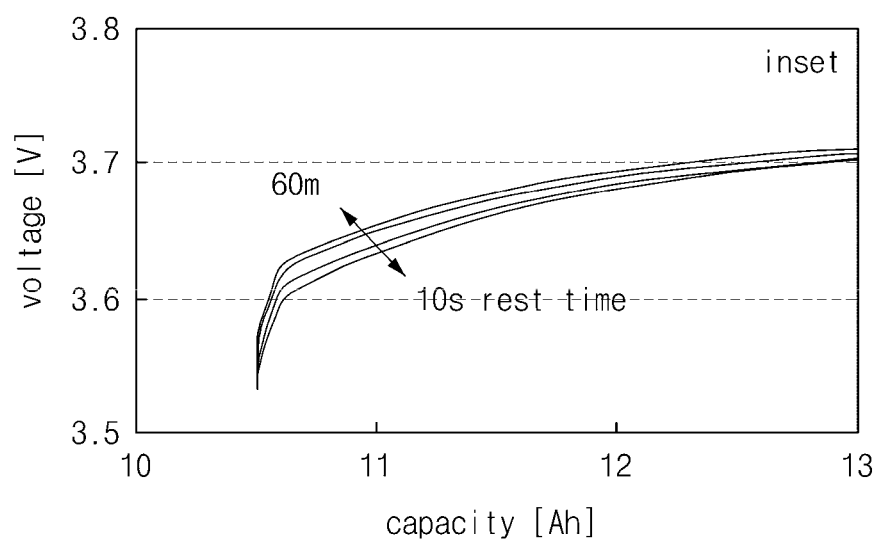

Rest time refers to a rest period, and a rest time between a duty cycle and charging may affect a charge curve. As illustrated in FIG. 9B, testing was performed during a rest period from 10 seconds to 30 minutes after a duty cycle in consideration of a charge habit of a user of the electric vehicle.

As illustrated in FIG. 9B, when charging starts after a longer rest period (rest time), a larger amount of overvoltage occurred. This is because a negative overvoltage was generated while the duty cycle within the rest time was eased. The rest time before charging affects the shape of the charge curve in this manner.

③ Duty Cycle

Duty cycle relates to charge/discharge rate, and a duty cycle before charging affects the shape of a charge curve. This is because a charge/discharge rate is affected by an overvoltage during the duty cycle. Here, the overvoltage is a degree of polarization indicating a terminal voltage variation from an open circuit potential (OCP) of a current passage.

Figure 9C:
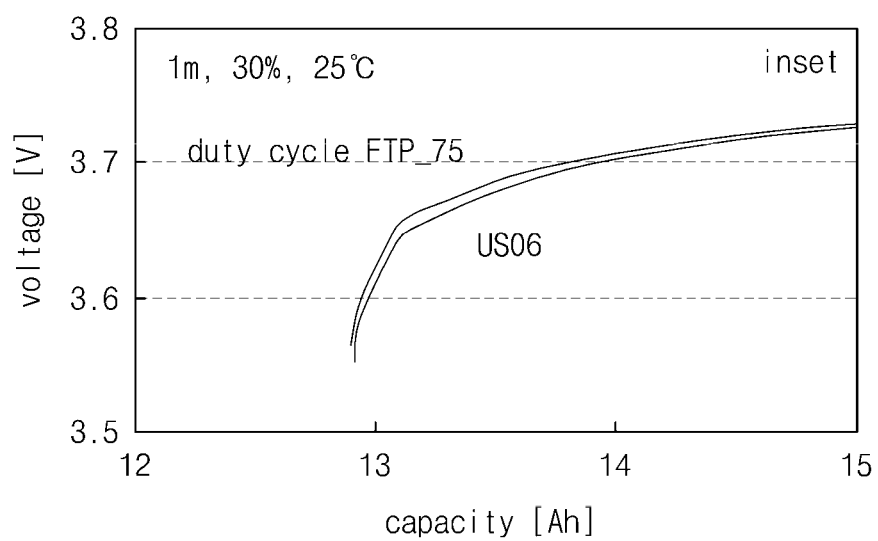
Figure 9D:
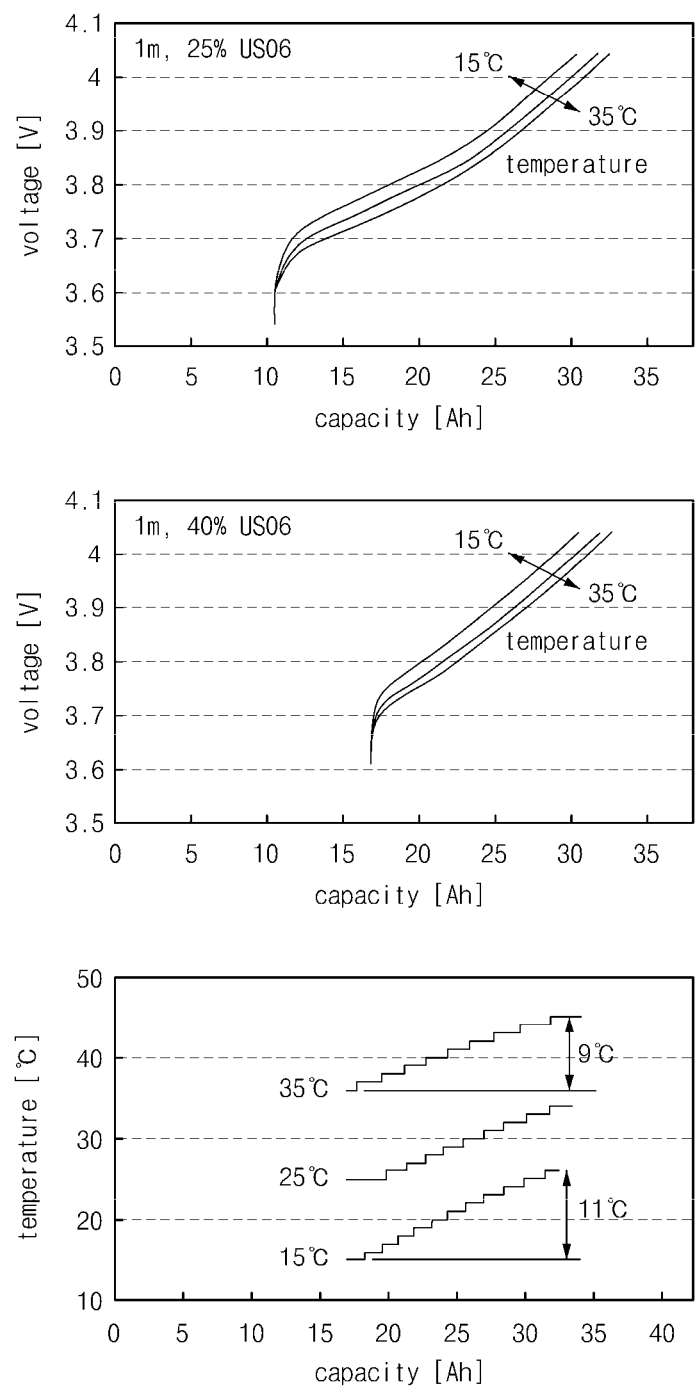

In FIG. 9C, FTP_75 is a duty cycle of driving in a city in which driving and stop are repeated and US06 is a duty cycle of driving on an expressway. In this manner, the duty cycles may differ according to a driving habit of a user of an electric vehicle.

During cycling, the latter causes a negative overvoltage greater than that of the former, and thus, as illustrated in FIG. 9C, when charging starts after driving, the latter generates a smaller amount of overvoltage than that of the former. For reference, a positive overvoltage makes the opposite influence. In this manner, the duty cycle before charging affects the shape of the charge curve.

④ Temperature

As illustrated in FIG. 9D, a low temperature before charging causes a higher voltage during charging, and thus, it reduces a battery capacity to reach a charge completion voltage earlier. Unlike other factors, temperature affects the entire part of the charge curve.

Here, an ambient temperature may be controlled, but a battery temperature before charging is affected by other factors such as duty cycle and rest time. For example, a duty cycle of a high charge/discharge rate causes a high battery temperature, and a rest time after the duty cycle causes a low battery temperature.

In FIGS. 9A to 9D, among the four operational factors, the SOC before charging affects the charge curve the most, and the operational factors (duty cycle, rest time, and SOC), excluding temperature, affect the early part of the charge curve and the effect thereof is decreased over time.

However, the metamodel established under the specific testing conditions cannot describe a shape of a charge curve affected by a real world condition, so the metamodel according to the present invention was extensively corrected.

☐ Model Reconfiguration

A metamodel represents a change in a shape of a charge curve corresponding to a present capacity indicated by a voltage (y axis) as a capacity function (x axis).

Together with the x axis, a start point of a charge curve is evaluated by a residual capacity before charging calculated by Equation 8 below.

Residual capacity (start point of charge curve)=SOC×SOH×nominal capacity       [Equation 8]

The nominal capacity is previously set by a cell manufacturer, while SOC and SOH are estimated and updated by a battery management system. When SOC before charging is set to 15%, estimated SOH before charging is set to 85%, and a nominal capacity is set to 42 AH, a start point of a charge curve is set to 5.36 Ah.

Figure 10:
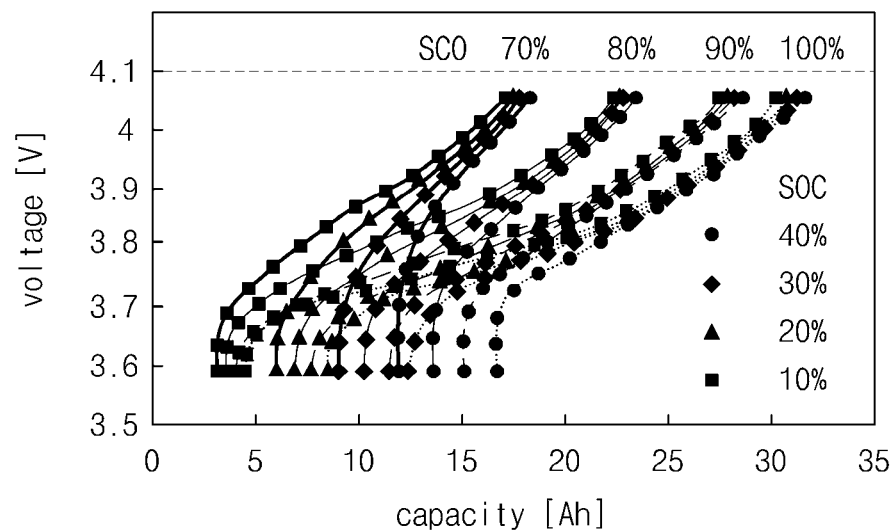
FIG. 10 is a graph illustrating a change in the shape of a charge curve when SOC before charging is 10% to 40%.

On the basis of this, a change in the shape of the charge curve according to 10% to 40% of the SOC before charging will be described. FIG. 10 is a graph illustrating a change in the shape of a charge curve when SOC before charging is 10% to 40%.

For the purpose of calculation efficiency, an input of the metamodel was set to one normalized capacity and SOC before charging was set to 40%. This results from internal inspection that the owner of the electric vehicle starts to search for a charging station when an SOC gauge drops to 40%. This, however, does not mean that 40% or greater of SOC before charging is not qualified for a metamodel.

However, every partial charge data of the metamodel is available to be used when battery charging starts from the SOC less than 40%. The reason is because charge data starting from an SOC exceeding 40% is insufficient to express a change in the shape of the charge curve according to battery aging.

Compared with the charge curve for establishing a metamodel according to the related art has a shape of a voltage (y axis) corresponding to a capacity (x axis), in the present invention, capacity is replaced by a time required for charging using the fact that battery charge between a vehicle and a grid is constant-current charge.

In this manner, in the present invention, capacity is replaced by time, but a start point of the charge curve is basically defined to be the same as that of the related art. A residual capacity before charging calculated as 13.23 Ah at the time of 50 kW quick charging corresponds to the time required for charging of about 781 seconds. This is induced from the fact that 781 seconds are required to reach 13.23 Ah in a constant current of about 61 A.

Figure 11A:
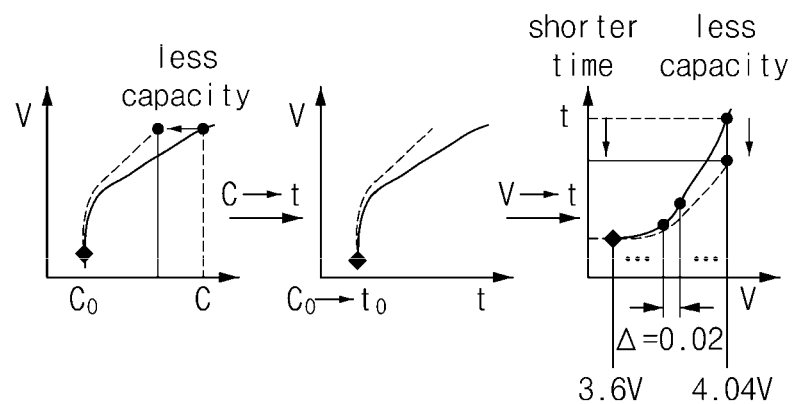
FIG. 11A, FIG. 11B, and FIG. 11C are views illustrating a process of converting a related art battery model into a metamodel according to an exemplary embodiment of the present invention, and a charge curve and a metamodel according to an exemplary embodiment of the present invention, respectively.
Figure 11B:
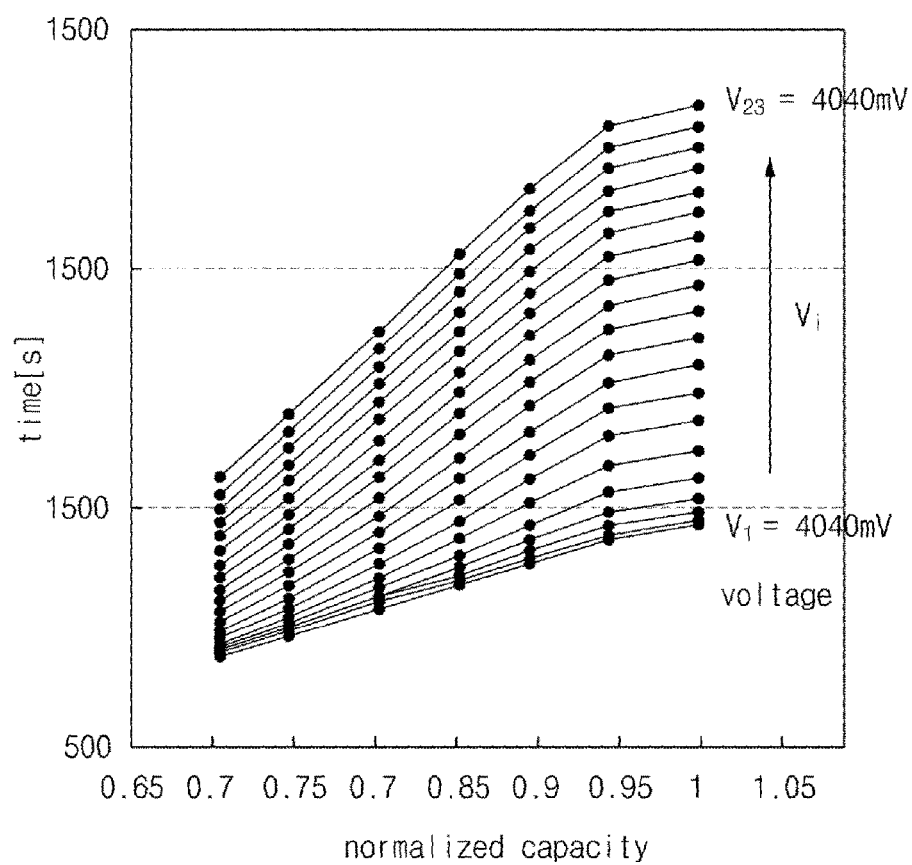
Figure 11C:
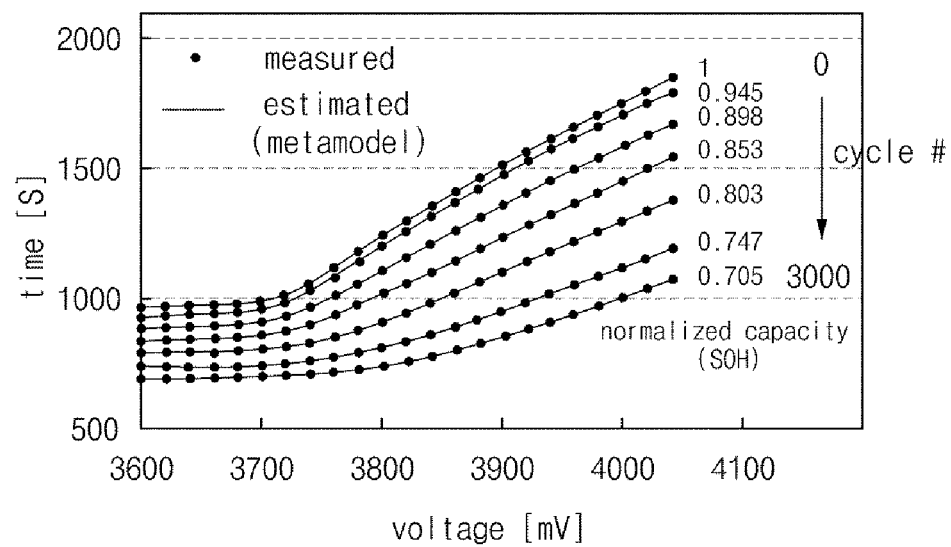

Hereinafter, a process of establishing a metamodel according to the present invention will be described with reference to FIGS. 11A to 11C. FIGS. 11A to 11C are views illustrating a process of converting a related art battery model into a metamodel according to an exemplary embodiment of the present invention, and a charge curve and a metamodel according to an exemplary embodiment of the present invention, respectively. FIGS. 11A to 11C illustrate a case in which a cell is charged at a 1.45 C rate corresponding to 50 kW quick charging.

First, as illustrated in FIG. 11C, a metamodel is re-formed to implement a pack level. Thereafter, a charge curve established from the metamodel is re-converted into a voltage (y axis) over time (x axis) (the middle graph of FIG. 11A).

However, in the metamodel, since voltage is more suitable for the horizontal axis than time in terms of characteristics of the metamodel, voltage is axis-changed so as to be provided as time (x axis) corresponding to the voltage (y axis) (the right graph of FIG. 11A). Here, the voltage is specified at an interval of 20 mV (Δ) within a range from 3600 to 4040 mV.

Once the battery is charged in SOC less than 40%, a charge curve thereof is moved within the voltage range (3600 to 4040 mV), regardless of loss thereof The voltage range may be specified by an application. However, since time is unspecific, it is difficult to be horizontal coordinates. In addition, time is proportional to capacity in constant current charging, and thus, the time required for charging according to the corresponding voltage range may be changed according to a present capacity. Also, since the present capacity (SOH, in fact) is a result of the metamodel, it may be more logical and intuitive to use time as a vertical axis (FIG. 11B).

As illustrated in FIG. 11C, the metamodel is re-formed to implement a pack level. A parameter estimator extracts an aging-related parameter (SOH) from the charge curve together with the metamodel to correspond to an unwanted change in the shape of the charge curve.

☐ Weighted Least Square (WLS)

In case of cell-level training data, OLS works well, and this owes to uncertainty of every data point of a charge curve. However, it is dubious whether the OLS is applied to a pack-level test data.

In the aforementioned test data, the early part of the shape of the charge curve is distorted by the real world condition such as the duty cycle before charging, rest time, SOC, and temperature. Thus, when the charge data is pitted to the metamodel, points at the late part than the points of the early part may be closer to the regression curve. Thus, in the present invention, a greater weight value is provided to the late part of the charge curve using a method of weighted least squares.

Figure 12A:
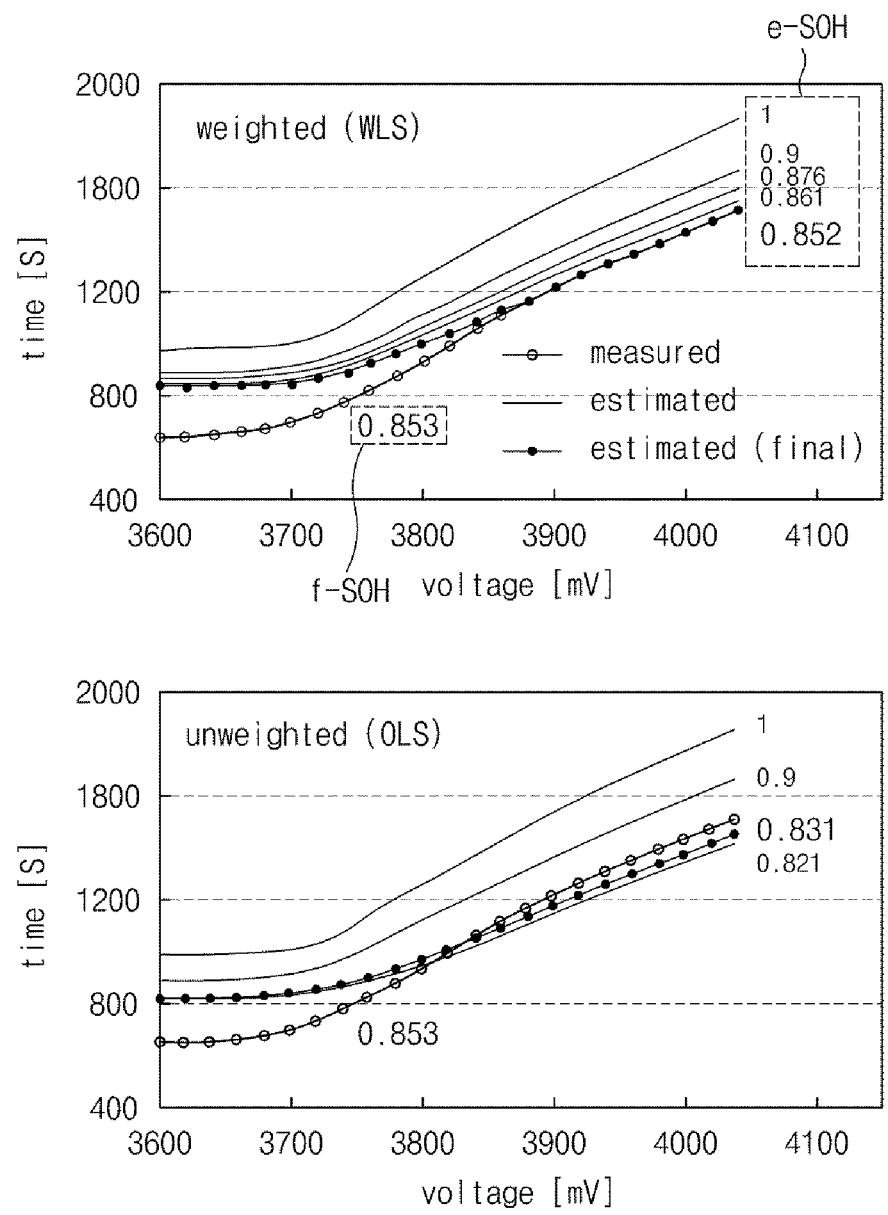
FIG. 12A, FIG. 12B, and FIG. 12C are graphs illustrating test results obtained by applying OLS and WLS to parameter estimation of a metamodel in various SOCs.
Figure 12B:
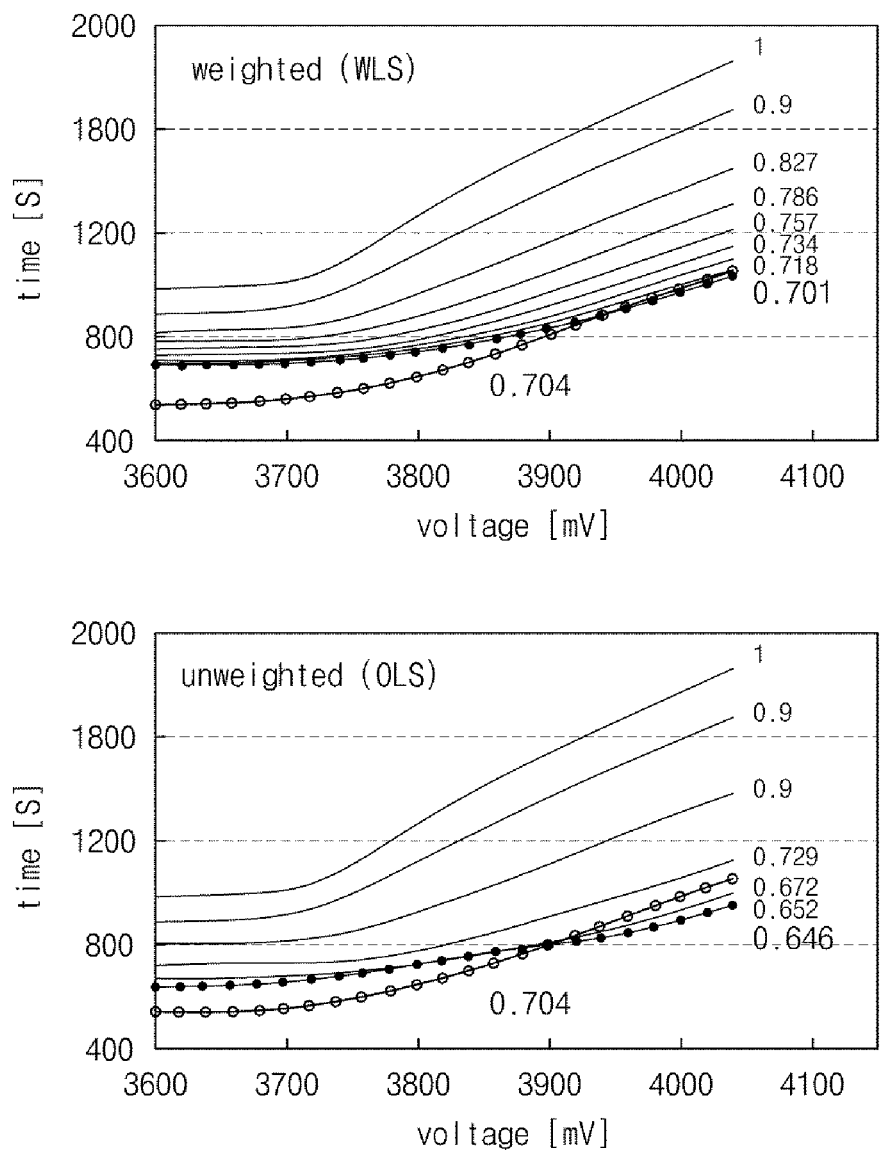
Figure 12C:
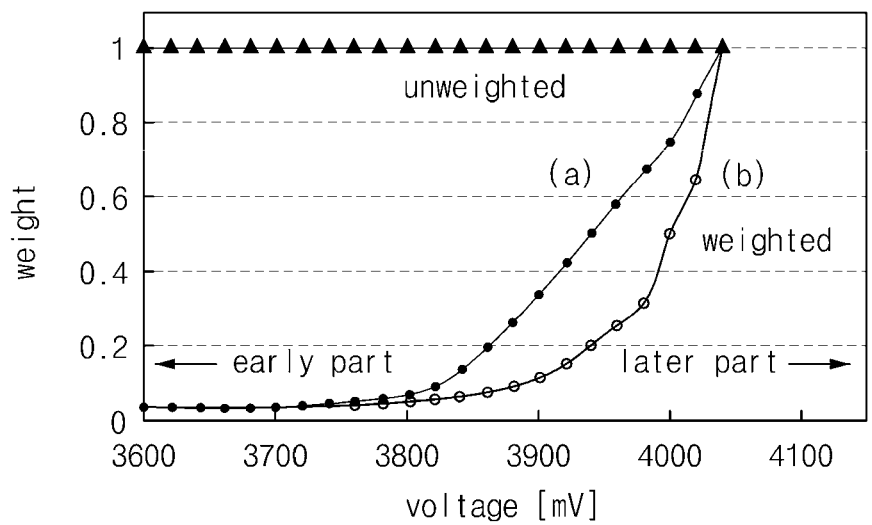

Hereinafter, an error between an estimated value and a measured value in a case in which a WLS and an OLS are applied to the metamodel will be described with reference to FIGS. 12A to 12C. FIGS. 12A to 12C are graphs of charge curves in a case in which OLS and WLS are applied to estimate SOH of a metamodel, while changing SOC.

1 to 0.852 shown on the right of the graphs of FIGS. 12A and 12B are estimated values (actual SOH) of SOH of the battery, and the decimal shown below the measured value charge curve is a measured value of SOH of the metamodel. Also, the graph of FIG. 12C shows an applied weight value, in which a weight value was not applied (unweighted) in case of OLS, and (a) is a weight value applied to a WLS graph of FIG. 12A and (b) is a weight value applied to the WLS graph of FIG. 12B.

In FIGS. 12A and 12B, it can be seen that the estimated value of the charge curve is close to the measured value when the WLS, rather than the OLS, is applied. For example, as illustrated in FIG. 12A, in a case in which the SOH measured value is 0.853, a final estimated value of the metamodel is 0.852 when the WLS is applied and 0.821 when the OLS is applied. In detail, in FIG. 12A, in a case in which the OLS is applied to the metamodel, when the WLS is applied, accuracy is improved by 2.5% and 7.8%, respectively, and thus, it can be seen that accuracy of SOH estimation is higher when the WLS is applied.

For reference, a weight value of the WLS determines how many points affect the final charge curve (that is, normalized capacity). However, as illustrated in FIG. 12C, in the present invention, a more accurate SOH can be estimated using a weight value in inverse proportion to error variance. Here, error variance refers to a relative difference between a measured value of a time required for charging and an estimated value.

Figure 13A:
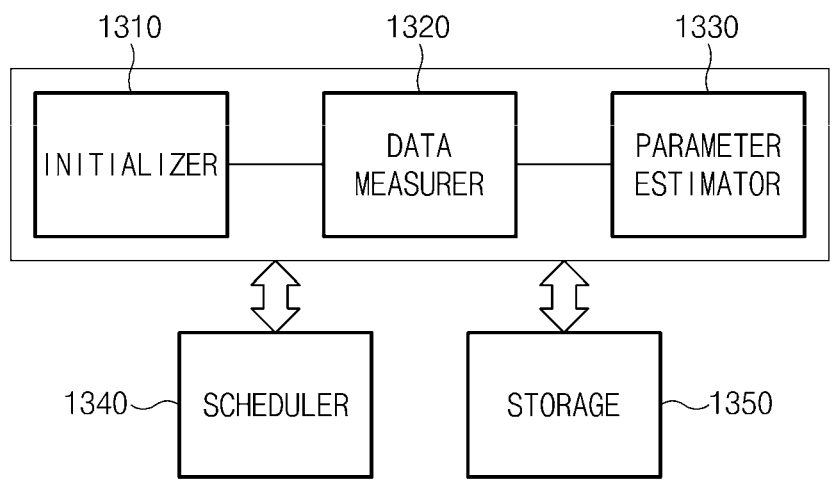
FIG. 13A is a block diagram of a battery management system according to an exemplary embodiment of the present invention.
Figure 13B:
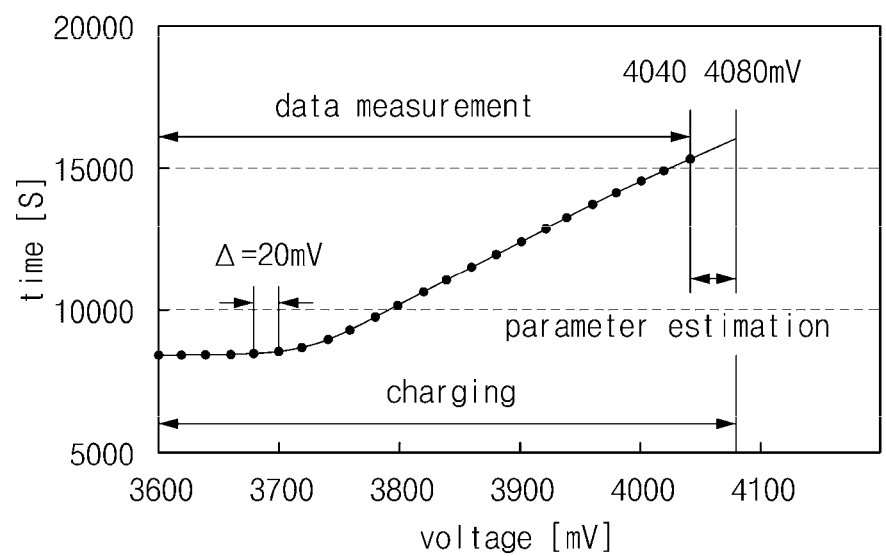
FIG. 13B is a graph illustrating a charge curve according to an exemplary embodiment of the present invention.
Figure 14A:
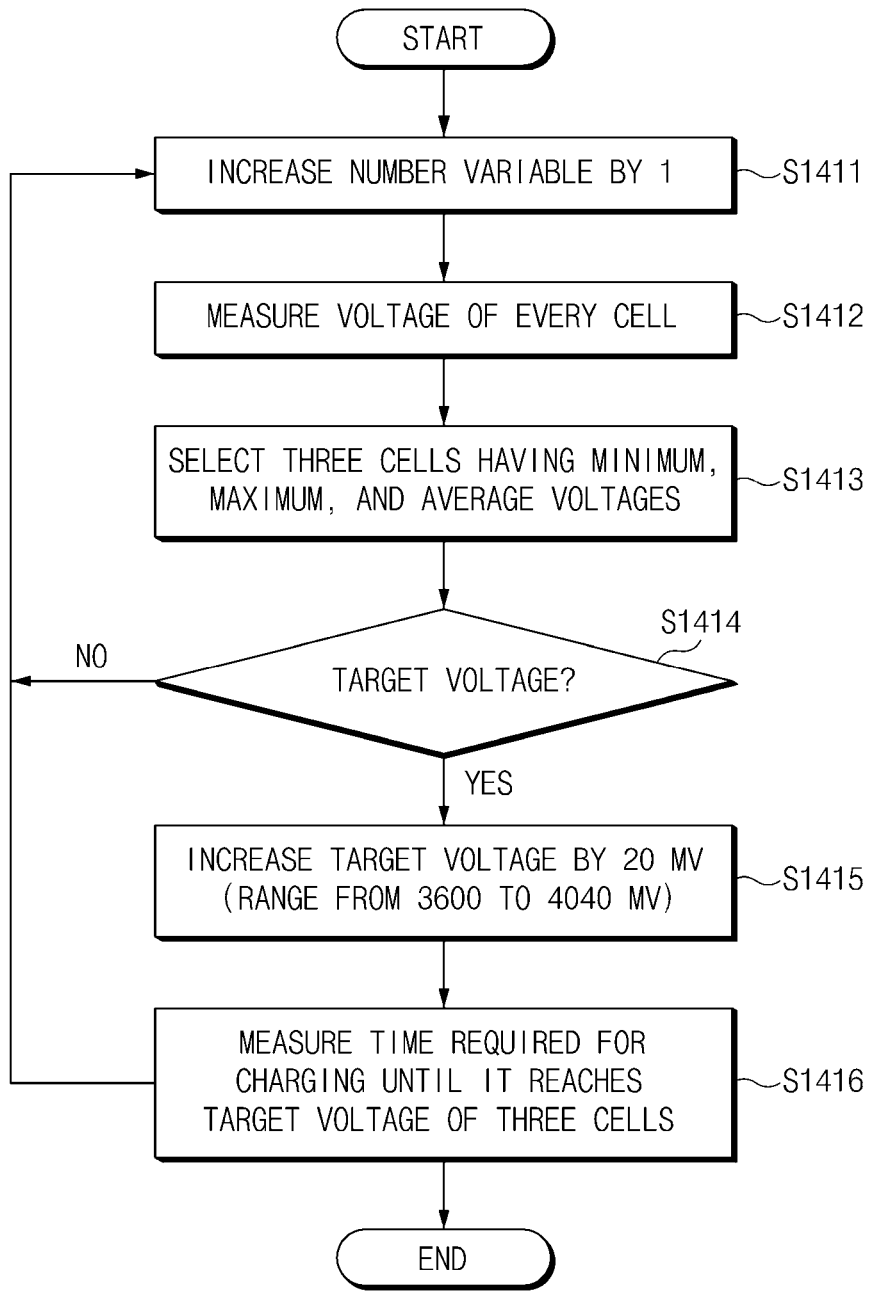
FIG. 14A is a flow chart illustrating a data measuring method according to an exemplary embodiment of the present invention.
Figure 14B:
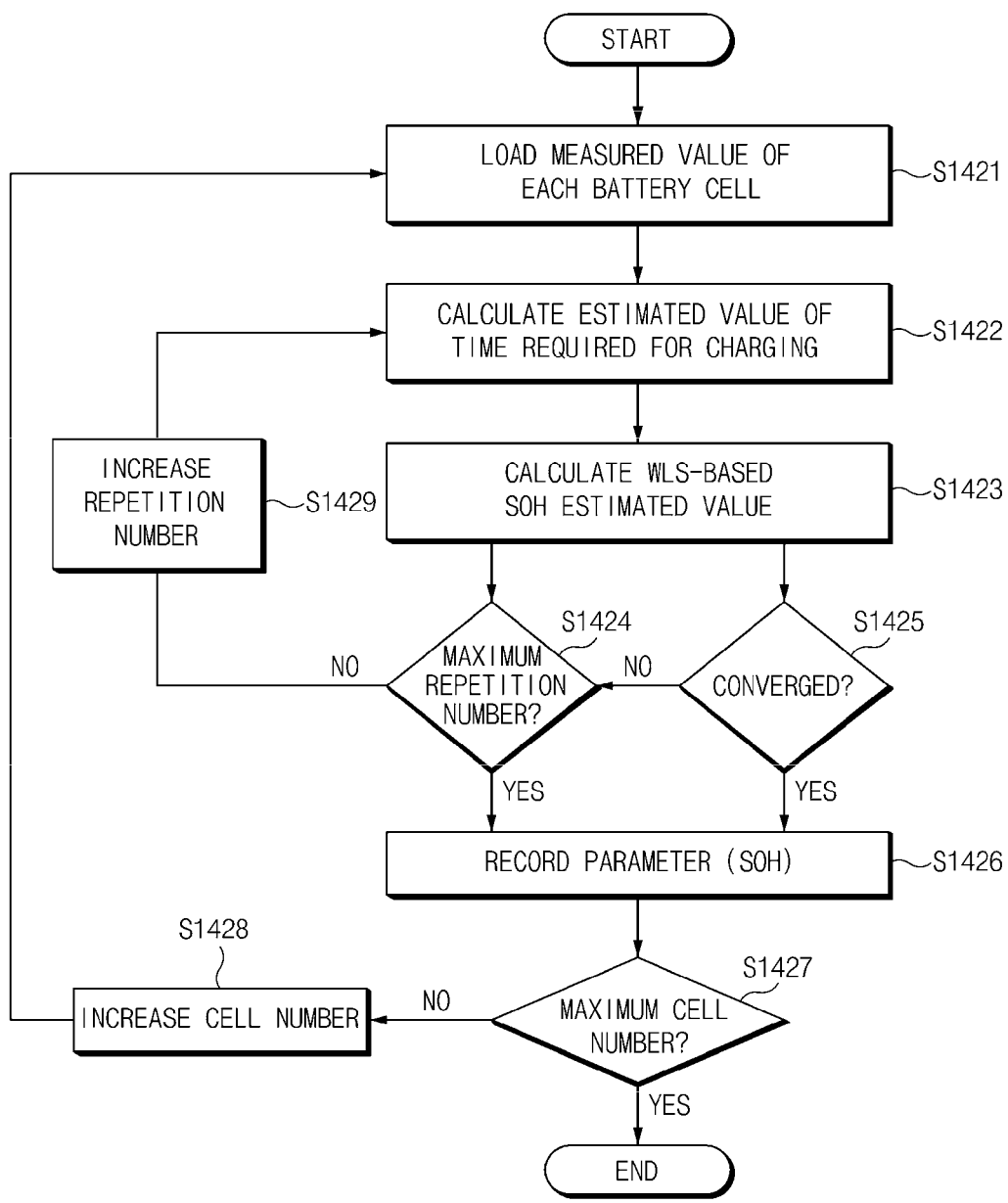
FIG. 14B is a flow chart illustrating a parameter estimating method according to an exemplary embodiment of the present invention.

Hereinafter, an exemplary embodiment of the present invention will be described in detail with reference to FIGS. 13A to 14B. FIG. 13A is a block diagram of a battery management system according to an exemplary embodiment of the present invention, FIG. 13B is a graph illustrating a charge curve according to an exemplary embodiment of the present invention, FIG. 14A is a flow chart illustrating a data measuring method according to an exemplary embodiment of the present invention, and FIG. 14B is a flow chart illustrating a parameter estimating method according to an exemplary embodiment of the present invention.

As illustrated in FIG. 13A, a battery management system 1300 according to an exemplary embodiment of the present invention includes a storage 1350, an initializer 1310, a data measurer 1320, a parameter estimator 1330, and a scheduler 1340.

The initializer 1310 checks a present capacity (normalized capacity) checked from previous charging within the storage 1350 and converts a residual capacity corresponding to the present capacity into initial time. Here, the initial time is a start point of a charge curve of a battery.

In detail, the initializer 1310 may convert the initial time in unit of time calculated by dividing the residual capacity by a charge current into a second unit (*3600 [sec]) as expressed by Equation 9 below.

$$\text{Initial time} = \frac{\text{Residual capacity}}{\text{Charge current}} \times 3600 \quad \text{[Equation 9]}$$

$$\text{Residual capacity} = \text{present capacity} * SOC$$

Here, the charge current may be a value measured by a current sensor of the battery management system. Also, the charge current may be a value transferred by a charging station.

The data measurer 1320 measures a plurality of times required for charging required for a battery voltage to be changed (charged) at a preset voltage interval within a preset voltage range at the time of battery charging, and stores the measured values in a vector y. Here, the voltage range and the voltage interval may vary, and hereinafter, a case in which the voltage range is 3600 to 4040 mV and the voltage interval is 20 mV will be described as an example. Here, the data measurer 1320 measures a total of 23 required times which may be expressed as 23 points of a charge curve (FIG. 14A).

Hereinafter, data measurement performed by the data measurer 1320 will be described with reference to FIG. 14A. Here, the data measurer 1320 may measure a charge voltage at a cycle (for example, every 100 ms) allocated by the scheduler 1340.

Referring to FIG. 14A, the data measurer 1320 increases a number variable (time) by 1 each time before measuring a voltage in operation S1411.

The data measurer 1320 measures voltages of all the cells of the battery in operation S1412 and selects three cells having minimum, maximum, and average voltages from the measured voltages in operation S1413.

The data measurer 1320 determines whether the voltages of the selected cells are preset target voltages in operation S1414. Here, the data measurer 1320 initially sets a target voltage to 3600 mV.

When the battery voltage is the target voltage, the data measurer 1320 increases the target voltage by 20 mV in operation S1415.

Thereafter, the data measurer 1320 measures a time required for charging during which voltages of the three selected cells have reached the target voltage in operation S1416. In this manner, the data measurer 1320 may measure the time required for charging per voltage interval until the voltages of the three cells reach 4040 mV, a charge completion voltage.

After collecting the times required for charging regarding the preset voltage range of the charge curve is completed, the parameter estimator 1330 estimates a parameter (battery SOH). In detail, when the battery voltage is greater than the voltage range, the parameter estimator 1330 calculates an estimated value of the time required for charging at each voltage interval according to predicted SOH by a preset metamodel. The parameter estimator 1330 estimates a predicted SOH in which an error between a measured value at each voltage interval and an estimated value of each voltage interval based on the WLS is the lowest, as a battery SOH. Hereinafter, a process of estimating an SOH by the parameter estimator 1330 will be described with reference to FIG. 14B.

The parameter estimator 1330 retrieves a measured value of the time required for charging of each battery cell from the storage 1350 in operation S1421. Here, the parameter estimator 1330 configures a measured value vector y using data from the storage 1350.

The parameter estimator 1330 estimates a time required for charging by the metamodel in operation S1422. In detail, the parameter estimator 1330 predicts a time required for charging of each measurement point of the charge curve by the metamodel and stores the predicted values in an estimated value vector x. Here, as illustrated in FIG. 12A, when parameter estimation starts, the parameter estimator 1330 initially sets a predicted SOH (e-SOH of FIG. 12A) to 1 and stores the time required for charging, a result of converting a charge curve of SOH 1 according to a calculated initial time, in the estimated value vector x. Thereafter, the parameter estimator 1330 may gradually reduce the predicted SOH and store the time required for charging corresponding to the charge curve in the estimated value vector x.

The parameter estimator 1330 calculates an SOH estimated value by the WLS on the basis of the time required for charging in operation S1423. In detail, the parameter estimator 1330 calculates a residual vector b by subtracting a measured value vector y from the estimated value vector x, and generates a weight value vector W in inverse proportion to the residual vector b. Also, the parameter estimator 1330 numerically calculates a primary part derivative Jacobian of the residual vector b through a preset method. Here, the residual vector b may be an error variance between the estimated value vector and the measured value vector.

Here, the parameter estimator 1330 estimates an SOH and updates a predicted SOH until the weighted least square sum is not reduced any more by a Jacobian vector J within a maximum repetition number in operations S1424 and S1425. The reason for limiting the repetition number is to complete parameter estimation before completion of charging the battery. For reference, a parameter estimation available time is reduced according to battery lifetime due to a limitation in the repetition number.

As the parameter estimator 1330 performs SOH estimation by updating the predicted SOH, when the weighted least square sum is converged or reaches the maximum repetition number, the parameter estimator 1330 estimates a corresponding predicted SOH as a battery SOH (f-SOH of FIG. 12A) in operation S1426.

The parameter estimator 1330 may perform the parameter estimation process on all the selected cells (three cells) in operations S1427 and S1428. Here, since the cell having the maximum voltage, among the three cells, first reaches the target voltage, the cell is the most aged cell with the smallest present capacity. Thus, the parameter estimator 1330 may determine an SOH estimated value of the maximum voltage cell, as a battery SOH. Alternatively, the parameter estimator 1330 may check an SOH variation of the battery cell using variations of SOH estimated values of the three cells. Here, the parameter estimator 1330 may provide the SOH variation to the user through a dashboard, or the like.

As mentioned above, since the initializer 1310, the data measurer 1320, and the parameter estimator 1330 are components of the battery management system, it is required to schedule task to perform battery capacity estimation with other tasks. Thus, the scheduler 1340 handles each task by a round robbin scheduler without priority.

In this manner, in an exemplary embodiment of the present invention, when a battery is charged with a constant current, an SOH is estimated using the time required for charging using features that current and time are matched in a one-to-one manner. Thus, even though a low-priced battery management system is used, accuracy of SOH estimation may be enhanced.

Also, in an exemplary embodiment of the present invention, since an error of the SOH estimated by the metamodel, which occurs due to operational factors of a real world condition, is reduced by the WLS, accuracy of SOH estimation may be enhanced.

Hereinafter, results of evaluating performance of the battery management system according to an exemplary embodiment of the present invention will be described with reference to Table 1. Table 1 shows estimation errors according to the results of estimating SOH, while changing operational factors in a real world condition.

In Table 1, SOC before charging was set to 15 to 40%, rest time before charging was set to a range from 10 seconds to 1 hour, a temperature was set to 15 to 35° C., and duty cycle was rarely defined like FTP_75 or US06. Also, an estimated error was calculated from a vantage point of parameter estimation, i.e., as a normalized capacity.

TABLE 1

| | measurement | | | | estimation | |
|---|---|---|---|---|---|---|
| no | SOH | SOC | temp [° C.] | rest [s] | SOH | error [%] |
| 1 | 0.782 | 0.3 | 25 | 40 | 0.779 | 0.43 |
| 2 | 0.879 | 0.4 | 28 | 102 | 0.88 | 0.05 |
| 3 | 1.005 | 0.36 | 25 | 55 | 1.004 | 0.45 |
| 4 | 0.834 | 0.31 | 24 | 32 | 0.821 | 1.49 |
| 5 | 0.708 | 0.32 | 26 | 45 | 0.692 | 2.29 |
| 6 | 0.987 | 0.29 | 23 | 52 | 0.972 | 1.6 |
| 7 | 0.934 | 0.35 | 27 | 69 | 0.932 | 0.26 |
| 8 | 0.976 | 0.25 | 29 | 3581 | 0.962 | 1.49 |
| 9 | 0.976 | 0.23 | 24 | 110 | 0.968 | 0.86 |
| 10 | 1.002 | 0.26 | 25 | 35 | 0.973 | 2.61 |
| 11 | 0.953 | 0.18 | 25 | 182 | 0.94 | 1.36 |
| 12 | 0.751 | 0.31 | 28 | 78 | 0.745 | 0.83 |
| 13 | 0.782 | 0.34 | 30 | 43 | 0.781 | 0.11 |
| 14 | 0.834 | 0.38 | 32 | 48 | 0.848 | 1.66 |
| 15 | 0.808 | 0.31 | 24 | 19 | 0.8 | 1.02 |
| 16 | 1 | 0.17 | 26 | 88 | 0.981 | 1.9 |
| 17 | 0.998 | 0.27 | 35 | 36 | 0.995 | 0.3 |
| 18 | 1.002 | 0.34 | 35 | 62 | 1.019 | 1.69 |
| 19 | 0.977 | 0.24 | 23 | 589 | 0.965 | 1.16 |
| 20 | 0.976 | 0.39 | 26 | 129 | 0.983 | 0.71 |
| 21 | 0.95 | 0.28 | 24 | 61 | 0.942 | 0.77 |
| 22 | 0.858 | 0.29 | 23 | 77 | 0.85 | 0.92 |
| 23 | 0.999 | 0.16 | 15 | 59 | 0.988 | 1.16 |
| 24 | 1.004 | 0.25 | 16 | 50 | 1 | 0.4 |

It can be seen from the results of testing performance shown in Table 1 that a residual capacity may be estimated within an estimated error of 3% even when operational factors are varied in which the metamodel coupled to the WLS deforms a shape of a charge curve.

According to the present invention, a battery aging state may be easily estimated.

Hereinabove, although the present invention has been described with reference to exemplary embodiments and the accompanying drawings, the present invention is not limited thereto, but may be variously modified and altered by those skilled in the art to which the present invention pertains without departing from the spirit and scope of the present invention claimed in the following claims.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A state of health (SOH) estimating system comprising:
a processor including a data measurer and a parameter estimator;
the data measurer determining a measured value of a time required for charging a battery at each of preset voltage intervals within a preset voltage range in which the battery is charged with a constant current; and
the parameter estimator determining an estimated value of a time required for charging the battery at each of the preset voltage intervals by a preset metamodel when a battery voltage is higher than the preset voltage range, and estimating a battery SOH in which an error between the measured value and the estimated value based on a weighted least square (WLS) is the lowest, and providing the estimated battery SOH to a user.

2. The SOH estimating system according to claim 1, wherein the preset voltage range is 3600 mV to 4040 mV, and the preset voltage interval is 20 mV.

3. The SOH estimating system according to claim 1, wherein the data measurer selects cells having the minimum, average, and maximum voltages, among all the cells forming the battery, and measures a time required for charging the battery at each of the preset voltage intervals of the three selected cells.

4. The SOH estimating system according to claim 3, wherein the parameter estimator estimates the battery SOH of each of the three selected cells, and determines an SOH of the cell having the maximum voltage, as the battery SOH.

5. The SOH estimating system according to claim 1, wherein the processor further includes an initializer, and wherein the initializer determines an initial time of a time required for charging the battery by converting a result obtained by dividing a residual capacity by a charge current into a unit of second, before the constant current charging.

6. The SOH estimating system according to claim 5, wherein when a parameter is initially estimated after the battery starts to be charged, the parameter estimator determines an estimated value of a time required for charging the battery by changing a charge curve when an SOH is 1 to correspond to the initial time.

7. The SOH estimating system according to claim 5, wherein the charge current is a value measured by a current sensor.

8. The SOH estimating system according to claim 1, wherein the parameter estimator updates a predicted SOH, determines an estimate value of a time required for charging the battery at each of the preset voltage intervals corresponding to the predicted SOH by the metamodel, determines a residual vector by subtracting a measured value of each of the preset voltage intervals from the determined estimated value of each of the voltage intervals, and estimates the predicted SOH in which a weighted least square sum of the residual vector is minimized, as the battery SOH.

9. The SOH estimating system according to claim 8, wherein when the residual vector is first determined after the battery starts to be charged, the predicted SOH is set to 1, and sequentially reduced according to a number of updating the predicted SOH within a preset unit by the metamodel.

10. The SOH estimating system according to claim 8, wherein the parameter estimator estimates the battery SOH, while updating the predicted SOH within a preset maximum repetition number and while updating the predicted SOH until the weighted least square sum of the residual vector is converged.

11. The SOH estimating system according to claim 8, wherein the weight value is set to be in inverse proportion to an error variance of the residual vector, a difference between the estimated value of a time required for charging the battery at each of the preset voltage intervals and the measured value of each of the preset voltage intervals.

12. A state of health (SOH) estimating method, as a battery management method based on at least one processor of an SOH estimating system wherein the at least one processor includes a data measurer and a parameter estimator, the SOH estimating method comprising:
determining, by the data measurer of the at least one processor, a measured value of a time required for charging at each of preset voltage intervals within a preset voltage range in which a battery is charged with a constant current;
determining, by the parameter estimator of the at least one processor, an estimated value of a time required for charging at each of the preset voltage intervals according to a predicted SOH by a preset metamodel when a battery voltage is higher than the preset voltage range; and
estimating, by the parameter estimator of the at least one processor, a predicted SOH in which an error between the measured value and the estimated value based on a weighted least square (WLS) is the lowest, as a battery SOH; and
providing, by the parameter estimator of the at least one processor, the estimated battery SOH to a user.

13. The SOH estimating method according to claim 12, wherein, in the determining of the measured value, cells having the minimum, average, and maximum voltages are selected from among all the cells forming the battery, and a time required for charging at each of the preset voltage intervals of the three selected cells is measured.

14. The SOH estimating method according to claim 13, wherein, in the estimating, the battery SOH of each of the three selected cells is estimated, and an SOH of the cell having the maximum voltage is determined as the battery SOH.

15. The SOH estimating method according to claim 12, further comprising:
determining, by an initializer of the at least one processor, an initial time of a time required for charging the battery by converting a result obtained by dividing a residual capacity by a charge current into a unit of second, before the battery is charged with a constant current.

16. The SOH estimating method according to claim 15, wherein the determining of the estimated value includes determining an estimated value of a time required for charging the battery by changing a charge curve of the predicted SOH to correspond to the initial time.

17. The SOH estimating method according to claim 12, wherein the estimating includes:
determining an estimate value of a time required for charging the battery at each of the preset voltage intervals corresponding to the predicted SOH by the metamodel;
determining a residual vector by subtracting a measured value of each of the preset voltage intervals from the determined estimated value of each of the preset voltage intervals; and
estimating the predicted SOH in which a weighted least square sum of the residual vector is minimized, as the battery SOH.

18. The SOH estimating method according to claim 17, wherein the predicted SOH is set to 1 initially when the battery starts to be charged, and sequentially reduced according to a number of updating the predicted SOH within a preset unit by the metamodel.

19. The SOH estimating method according to claim 17, wherein the estimating includes estimating the battery SOH, while updating the predicted SOH within a preset maximum repetition number and while updating the predicted SOH until the weighted least square sum of the residual vector is converged.

20. The SOH estimating method according to claim 17, wherein the weight value is set to be in inverse proportion to an error variance of the residual vector, a difference between the estimated value of a time required for charging the battery at each of the preset voltage intervals and the measured value of each of the preset voltage intervals.

* * * * *